United States Patent [19]

Sato et al.

[11] Patent Number: 5,193,067
[45] Date of Patent: Mar. 9, 1993

[54] BATTERY CONDITION DETECTON APPARATUS

[75] Inventors: Hirohide Sato, Toyokawa; Yoshiya Hatakeyama, Joyo, both of Japan

[73] Assignees: Nippondenso Co., Ltd., Kariya; Japan Storage Battery, Kyoto, both of Japan

[21] Appl. No.: 444,873

[22] Filed: Dec. 4, 1989

[30] Foreign Application Priority Data

Dec. 5, 1988 [JP] Japan .................................. 63-307243
Dec. 15, 1988 [JP] Japan .................................. 63-317164
Aug. 1, 1989 [JP] Japan .................................... 1-199896

[51] Int. Cl.$^5$ ............................................. G01N 27/46
[52] U.S. Cl. ........................................ 364/483; 320/39;
320/43; 324/431; 364/481; 364/550;
364/571.03
[58] Field of Search ................... 320/18, 21, 22, 37,
320/39, 32, 43, 48; 73/32 A; 324/427, 430, 433,
431, 432; 364/480, 481, 483, 496, 571.01-571.08

[56] References Cited

U.S. PATENT DOCUMENTS 4,731,601 3/1988 Nowakowshi et al. ............. 324/431

FOREIGN PATENT DOCUMENTS 53-127646 11/1978 Japan .
55-23435 2/1980 Japan .
59-142482 8/1984 Japan .
60-24435 2/1985 Japan .
60-112266 6/1985 Japan .

Primary Examiner—Kevin J. Teska
Attorney, Agent, or Firm—Cushman, Darby & Cushman

[57] ABSTRACT

A battery condition detection apparatus comprises at least the first two of a battery discharge current detector, a battery terminal voltage detector, and a battery electrolyte concentration signal detector. The battery condition detection apparatus further comprises a memory circuit for storing detection signals generated by at least the first two detectors and inputted to the battery condition detection apparatus, and a computation device for executing computation processing on output signals from the aforesaid detectors.

With the foregoing structure, the battery condition detection apparatus performs computation to obtain at least one of corrected values of the battery terminal voltage and the battery electrolyte concentration in the state where the battery discharge current assumes a predetermined value, and performs the detection of the battery condition and/or the control of power generation of a battery-charging generator.

8 Claims, 14 Drawing Sheets

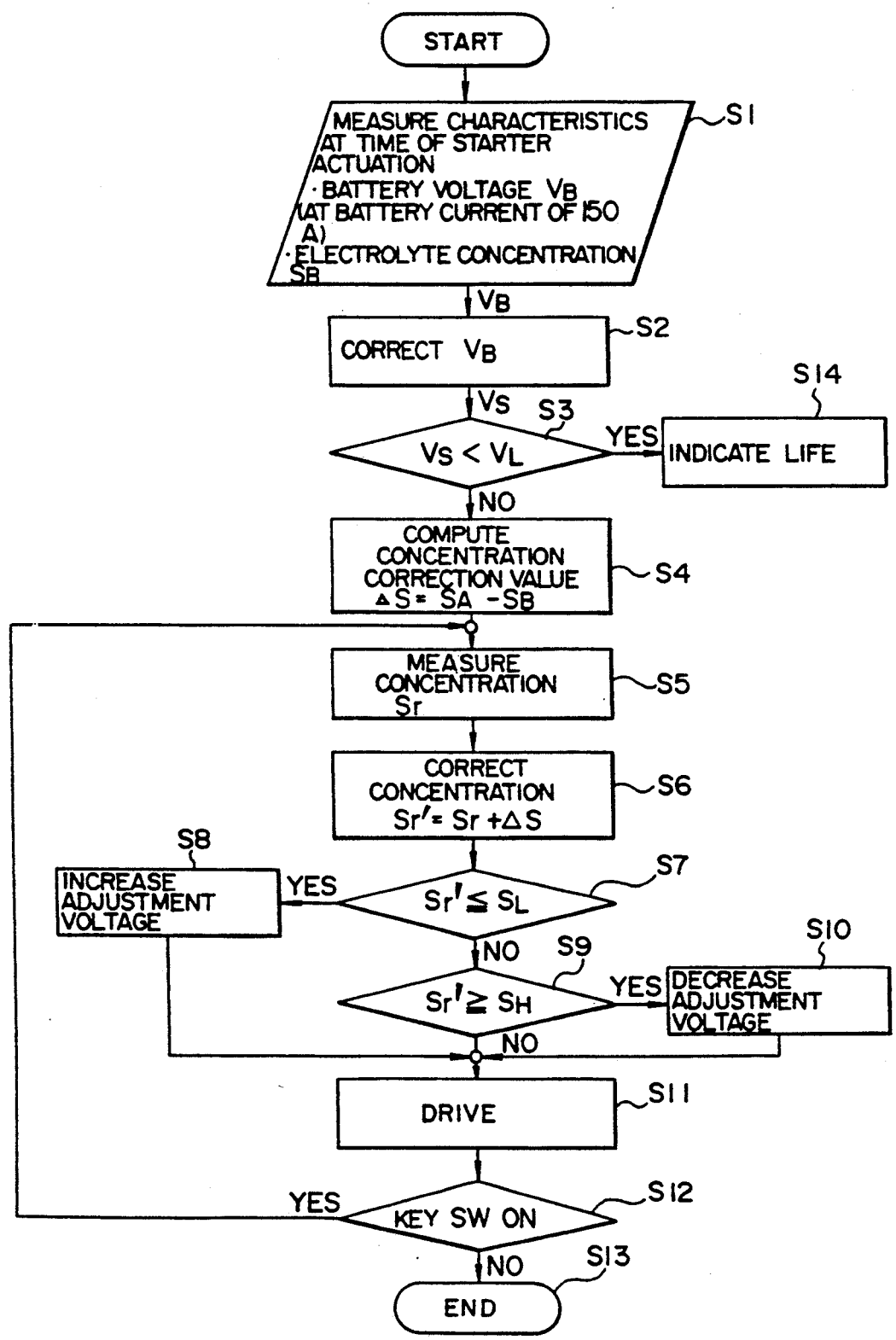

STARTER SWITCH ON

BATTERY CONDITION DETECTON APPARATUS

BACKGROUND OF THE INVENTION

1. Field of the Invention

The present invention relates to a battery condition detection apparatus for determining a charging condition, namely a capacity of an automotive battery accurately.

2. Description of the Related Art

The specific gravity of the battery electrolyte has conventionally been measured by a specific gravity sensor as a means for detecting the battery condition (a residual capacity, etc.). The problem of the above-mentioned conventional means is that if the battery electrode is deteriorated or if a liquid level of the battery drops due to overcharge of the battery, the relationship between the specific gravity and the battery capacity is changed undesirably from the relationship therebetween under a normal condition, thereby making it impossible to measure the battery condition (capacity) accurately.

Another conventional apparatus for detecting the battery condition (a residual capacity, etc.) is well known, as disclosed in JP-A-53-127646, in which internal impedance of a battery is determined from a battery discharge current and a battery voltage, so that the battery charging state is detected on the basis of the internal impedance which is increased with the deterioration of the battery charging condition (a reduction in the residual capacity).

If the battery condition is to be evaluated accurately, however, it is necessary to determine the internal impedance from a battery terminal voltage $V_S$ upon conduction of a predetermined reference discharge current $I_S$. A starter current under a cranking operation of an engine greatly varies depending on the type and temperature of the engine. The aforementioned conventional apparatus, in which the internal impedance is determined only from a ratio between a starter current happening to flow and the battery terminal voltage at the start of an engine operation, poses a problem such that the battery condition cannot be measured accurately.

Another problem is that, even if it is desired to determine the battery terminal voltage $V_S$ at a moment when the starter current has reached a predetermined reference discharge current level $I_S$, the starter current does not rise up to the reference discharge current level $I_S$ due to the engine temperature or the like, thus making the measurement impossible.

Further, there was a further problem that the reference discharge current $I_S$ is 150 A to 300 A for an ordinary class of automobiles and 50 A to 100 A for a lightweight class of automobiles, so that it is necessitated to change the setting of the reference discharge current $I_S$ depending on the type of an automobile carrying the battery.

The present invention has been made in order to solve the above-mentioned problems of conventional apparatuses.

SUMMARY OF THE INVENTION

A first object of the present invention is to provide a battery condition detection apparatus which stores the value of one of parameters including a battery discharge current, battery voltage and internal resistance related to a value of the battery electrolyte concentration together with the value of the battery electrolyte concentration per se which provides a reference value. Then, when the discharge current exceeds a predetermined value, the value of said one parameter is detected. At the same time or before or after that time, an electrolyte concentration detection signal representing the electrolyte concentration is detected by electrolyte concentration signal detection means, and an electrolyte concentration signal correction value is obtained from the value of the stored electrolyte concentration corresponding to the detected one parameter and the electrolyte concentration detection signal. After that, an electrolyte concentration signal detected by the electrolyte concentration signal detection means is corrected by using the aforementioned electrolyte concentration signal correction value, whereby an accurate battery condition is detected on the basis of the corrected electrolyte concentration signal.

A second object of the present invention is to provide a battery condition detection apparatus in which, in order to obtain an accurate value of the internal impedance of a battery, a plurality of values of the battery terminal voltage are obtained in the state where a predetermined value of battery discharge current is caused to flow, and an average value of the battery terminal voltage is calculated, or alternatively, a plurality of values of the battery discharge current are obtained successively in the state where the battery terminal voltage has a predetermined value, and an average value of the battery discharge current is calculated, so that an accurate value of the internal impedance of a battery is determined, thereby detecting a battery condition.

A third object of the present invention is to provide a battery condition detection apparatus in which, in order to improve the aforementioned apparatus for attaining the second object, a reference discharge time terminal voltage of a battery is calculated by using a voltage-current approximation line obtained from the battery currents and voltages detected at a plurality of time points while a starter is actuated, and a battery condition is determined on the basis of the reference discharge time terminal voltage.

The battery condition detection apparatus of the present invention has an advantage such that an always accurate battery condition is determined by making correction of a detected electrolyte concentration signal by using a concentration signal correction value which is detected at the time of discharge of the battery.

The battery condition detection apparatus of the present invention has another advantage such that accurate internal impedance is determined by obtaining accurate corresponding values for the battery voltages and battery discharge currents at the time of discharge of the battery, thereby making it possible to determine an accurate battery condition without using any special additional detectors.

BRIEF DESCRIPTION OF THE DRAWINGS

FIG. 3 is a flowchart showing the process of control in a microcomputer according to the aforementioned embodiment.

DESCRIPTION OF THE PREFERRED EMBODIMENTS

An embodiment of the present invention will be explained below with reference to the accompanying drawings.

First, an explanation will be made of an embodiment of the present invention in which a battery condition is detected by using a corrected electrolyte concentration signal. This first embodiment relates to an apparatus in which a corrected battery voltage is obtained from a detected battery voltage value in the state of a predetermined magnitude of discharge current, and a concentration correction value is obtained from a reference electrolyte concentration related to the corrected battery voltage and an actually measured electrolyte concentration. The concentration correction value thus obtained is used to correct the values of subsequent actually measured electrolyte concentrations, and further the power generation is controlled in such a manner that the value of the actually measured electrolyte concentration remains within a predetermined range.

Figure 1:
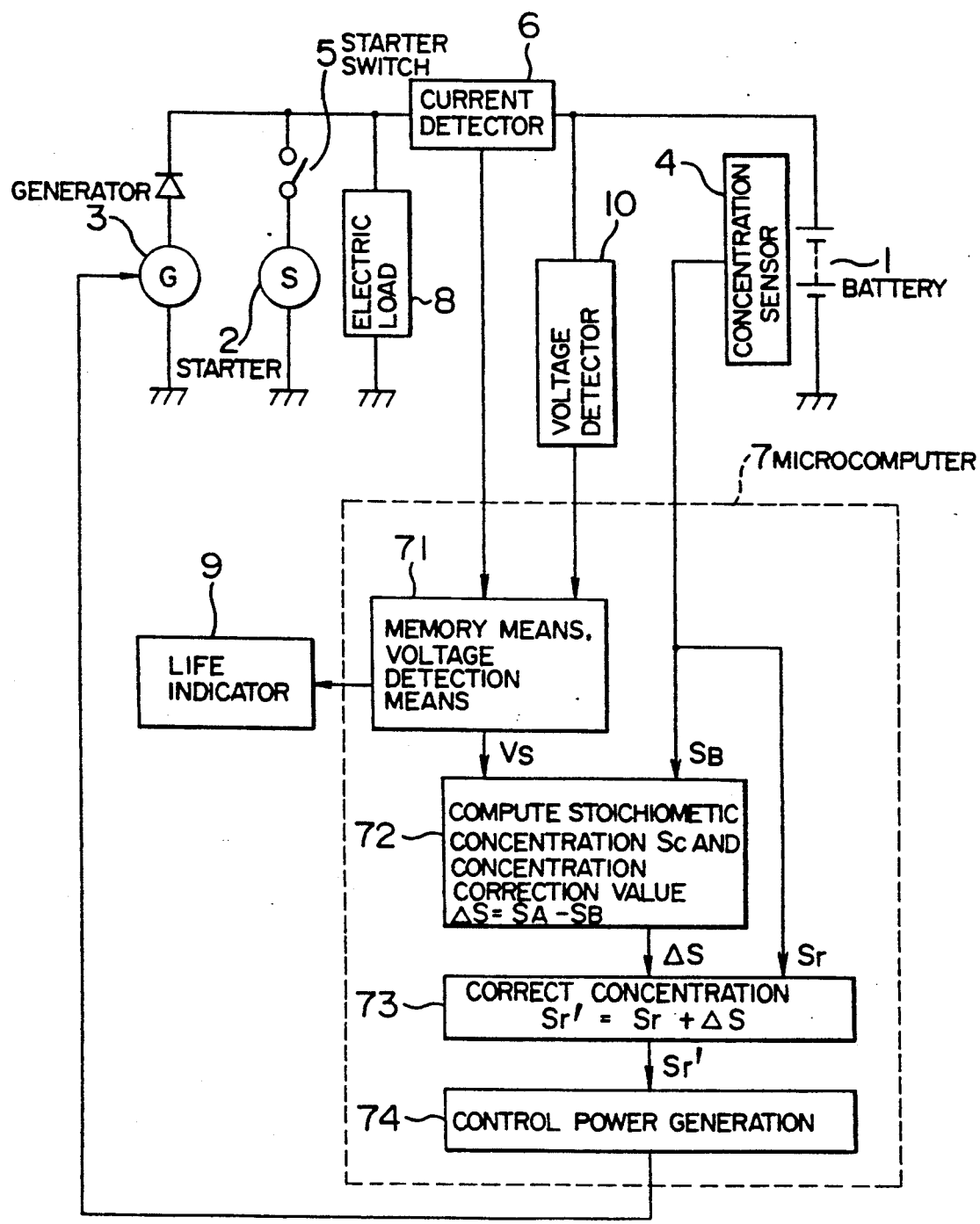
FIG. 1 is a diagram showing an electric circuit of power generation control means employing a battery condition detection apparatus according to a first embodiment of the present invention.

In FIG. 1, reference numeral 1 designates a car battery, numeral 2 a starter, numeral 3 a generator, numeral 4 a concentration sensor for detecting the concentration of the reactive substance, here sulfuric acid, in the battery 1, numeral 5 a starter switch for actuating the starter, numeral 6 a current detector for detecting the battery discharge current, numeral 7 a microcomputer, numeral 8 an electric load, numeral 9 an indicator for indicating the service life of the battery 1, and numeral 10 a battery voltage detector.

Figure 2:
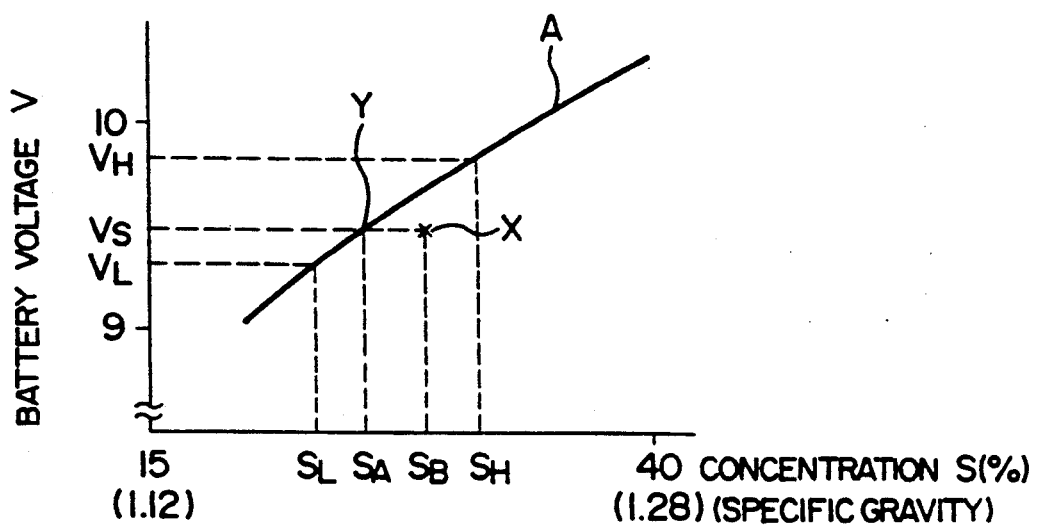
FIG. 2 is a characteristic diagram showing the relationship between the battery voltage and the electrolyte concentration.

FIG. 2 is a reference characteristic diagram showing a curve A of a battery voltage V against the sulfuric acid concentration S of the electrolyte of a new battery, obtained by measuring the battery voltage with the discharge current of 150 A sustained for about five seconds for various sulfuric acid concentrations of the electrolyte. In this diagram, $V_L$ designates a voltage required for driving the starter 2, associated with the sulfuric acid concentration $S_L$ of the battery 1. More specifically, it is understood that when the sulfuric acid concentration S of the battery electrolyte is small, the battery voltage V is low. This characteristic is stored in the microcomputer 17.

Now, the control operation in the microcomputer 7 will be explained together with the program shown in FIG. 3. First, upon actuation of the starter 2 with the starter switch 5 closed, the discharge current of the battery 1 is measured by a current detector 6. When the discharge current of 150 A of the battery 1 is detected by first detection means 71, a battery voltage detector 10 detects the voltage V providing one of parameters indicating the state of the battery 1.

The reason why the battery voltage is measured when the discharge current of the battery 1 reaches 150 A is to secure the battery performance for driving the starter in view of the fact that a stable relationship between discharge currents and voltages cannot be obtained for the discharge current of less than about 30 A of the battery 1 and that the current is normally more than 100 A in driving the starter 2. The discharge current in measuring the battery voltage, however, is not necessarily limited to 150 A.

The recommended time of detecting the sulfuric acid concentration of the battery 1 by the concentration sensor 4 is before the state of the battery 1 changes from that at the time of voltage measurement (for example, within 5% in concentration change). The electrolyte concentration may be measured before actuation of the starter 2 taking into account the fact that the state of the battery 1 remains substantially unchanged even if a current of several hundred A is supplied for about one second at the time of driving the starter 2.

The battery voltage $V_B$ obtained in step 1 is corrected at step 2. The reason for this correction will be explained below.

Figure 4:
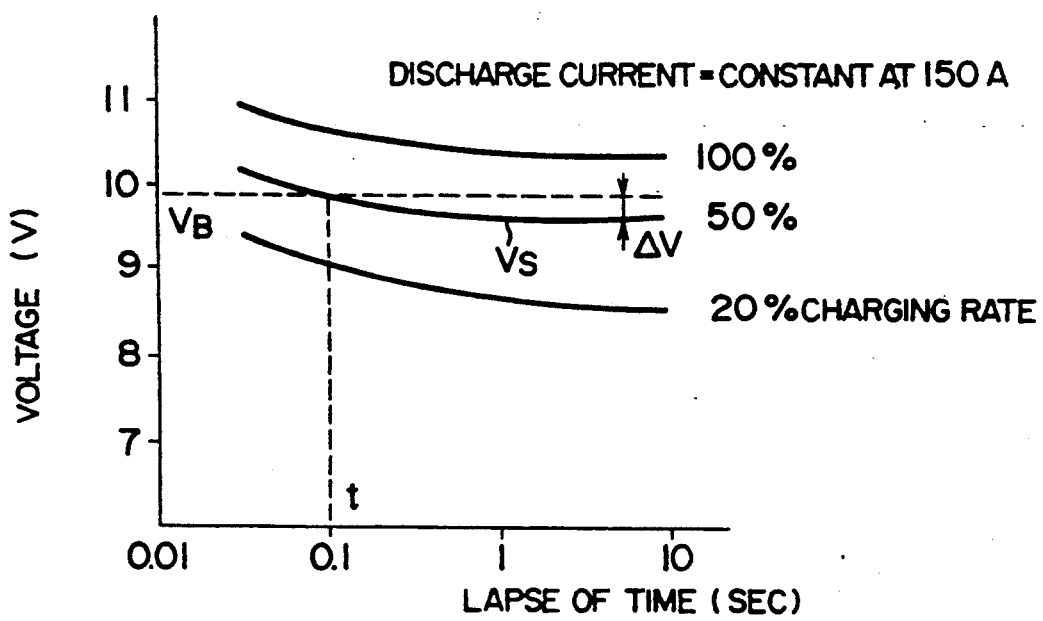
FIG. 4 is a characteristic diagram showing the battery voltage versus the lapse of time characteristic when the battery is discharged.

As shown in FIG. 4, the voltage V with the battery 1 discharged decreases with time, and reaches a steady level in about five seconds. For this reason, the engine is started by driving the starter 2 normally within a second. The measurement of the battery voltage at the time of driving the starter in step 1 thus indicates a voltage higher than the steady level.

If the relationship between the battery characteristic and the discharge time is determined in advance and the correction value $V_S$ is determined by correcting the detection value $V_B$ by applying thereto a difference $\Delta V$ between the detection value $V_B$ based on a starter current and a steady value determined from the time t of detection as shown in FIG. 4, it is possible to obtain a voltage-current characteristic of the battery with greater accuracy.

The rate of voltage drop is substantially the same for the charge rate of 30% or more, and therefore the steady voltage level five seconds later may be measured by estimation based on the rate of voltage drop from the time of actual battery voltage measurement.

Then, step 4 performs correction for obtaining a reference specific gravity. An explanation will be made with reference to the characteristic diagram of FIG. 2. Assume that steps 1 and 2 have determined the correction voltage $V_S$ and the concentration $S_B$ of the battery 1 at the time of driving the starter, that is, the case at point X. In this case, the concentration $S_B$ is high as compared with the concentration $S_A$ (point Y) for the reference characteristic A, indicating a deteriorated condition of the battery 1 (such as a reduced quantity of the electrolyte or an exhausted life of the battery 1).

Under the reference characteristic A, it is possible to drive the starter 2 as the voltage of the battery 1 is higher than $V_L$ to the extent that the concentration of the battery 1 is higher than $S_L$. If the condition of the battery 1 is deteriorated as mentioned above, however, the concentration S increases and the battery voltage is apparently decided to be high, so that, if a control operation based on the concentration S is effected, the concentration S would be regarded as high in spite of a low battery voltage, resulting in a starter failure.

Step 4, therefore, determines the reference battery concentration $S_A$ at the battery voltage $V_S$ based on the reference characteristic A stored in the microcomputer 7, and calculates a concentration correction value $\Delta S = S_A - S_B$ from the actually measured concentration $S_B$ and the reference value $S_A$. The above calculation is performed at step 4 which is executed in the block 72 in FIG. 1 which includes both a second detection means and a concentration correction value computation means.

Step 5 detects the concentration $S_r$ of the battery 1 at predetermined intervals of time (while the vehicle is running or in other modes) after the engine start by means of the concentration sensor 4.

Step 6 adds the concentration correction value $\Delta S$ obtained at step 4 to the concentration $S_r$ determined at step 4 to produce a real concentration $S_r'$. Specifically, in view of the fact that a deteriorated battery 1 has an increased concentration as shown in FIG. 2, it is possible to determine an accurate concentration always for a predetermined voltage by correcting the concentration. The correction of the concentration obtained by the concentration sensor 4 thus permits always accurate detection of the condition (capacity) of the battery 1.

Since the battery characteristic (the relationship between an electrolyte concentration and a voltage at the time of discharge determined by the remaining life, electrolyte concentration, etc. of the battery) undergoes a gradual change, it is sufficient to measure the concentration correction value $\Delta S$ at least once when the starter is energized for each time of drive.

An accurate concentration-voltage relationship is always secured by power generation control based on the corrected concentration $S_r'$. As shown at step 7, if power generation is controlled in such a manner that the corrected concentration $S_r'$ is always equal to or larger than $S_L$ (if $S_r' \leq S_L$, the control voltage is increased at step 8), therefore, the battery voltage at the time of driving the starter is always greater than $V_L$, thus making an accurate actuation of the starter possible.

Step 9 compares the concentration values $S_r'$ and $S_H$ on condition that step 7 secures the relationship $S_r' \geq S_L$. The value $S_H$ is determined by the fuel economy or the like and has a predetermined margin with respect to $S_L$. Specifically, if power generation is controlled to secure the relationship $S_r' < S_H$ at steps 9 and 10, the battery 1 would not be required to be charged more than necessary (such a charging would increase an adjustment voltage unnecessarily), and the resulting lower adjustment voltage could save the load of the generator 3 as compared with that of the engine, thus reducing fuel cost. Also, a reduced charge of the battery 1 prevents a drop in liquid level of the battery electrolyte.

In other words, the power generation control to secure the specific gravity $S_r'$ in the range $S_L \leq S_r' \leq S_H$ at steps 7 to 10 maintains the battery in a balanced state, thus assuring smooth starting of the vehicle engine (preventing emptying of a battery) while at the same time producing the effect of reducing the fuel consumption rate and the rate of decrease in electrolyte at the same time.

These effects could be secured more firmly if the charging capacity is improved or discharged is prevented by raising the idling level or cutting off the electric load of the engine, in the case where a change in the adjustment voltage alone is not sufficient to charge the battery as intended due to the capacity of the generator.

In the method of correcting the concentration mentioned above, the concentration detection value $S_r$ is not necessarily corrected by $S_r' = S_r + \Delta S$ at step 6. Instead, the concentration decision values $S_H$ and $S_L$ for power generation control may be corrected as new decision values $S_H' = S_H - \Delta S$ and $S_L' = S_L - \Delta S$ respectively to control power generation in such a manner as to attain the concentration value $S_r$ at step 5 while holding the relations $S_L' < S_r < S_H'$.

Further, if the battery voltage $V_S$ obtained at step 1 is lower than $V_1$ at step 3 regardless of the power generation control mentioned above, step 14 may issue an alarm for designating the time of replacing the battery.

Also, in spite of the fact that the decision value $V_L(S_L)$ used for power generation control is the same as $V_L$ for life alarm in this embodiment, the value $V_{L2}$ ($V_{L2} > V_L$) is normally used as the decision value $V_L$ for power generation control allowing for a predetermined margin. Further, an average of the concentration correction value $\Delta S$ calculated from several past measurements may be used to further improve correction accuracy.

According to the aforementioned embodiment, the battery characteristic for actuating the starter is measured by determining the battery voltage $V_B$ at the time of discharge of a predetermined current (150 A) and comparing it with the electrolyte concentration $S_B$. In place of this method, however, taking into consideration the relationship $E - V = IR$ (in which R designates internal resistance of the battery depending on the charging condition, and E is the electromotive force of the battery) between the discharge current and the voltage representing the battery performance, the discharge current or internal resistance for a predetermined battery voltage (say, 9.5 V) may alternatively be detected as a battery characteristic as of the time of starter actuation thereby to detect the battery condition based on the discharge current and internal resistance.

Figure 5:
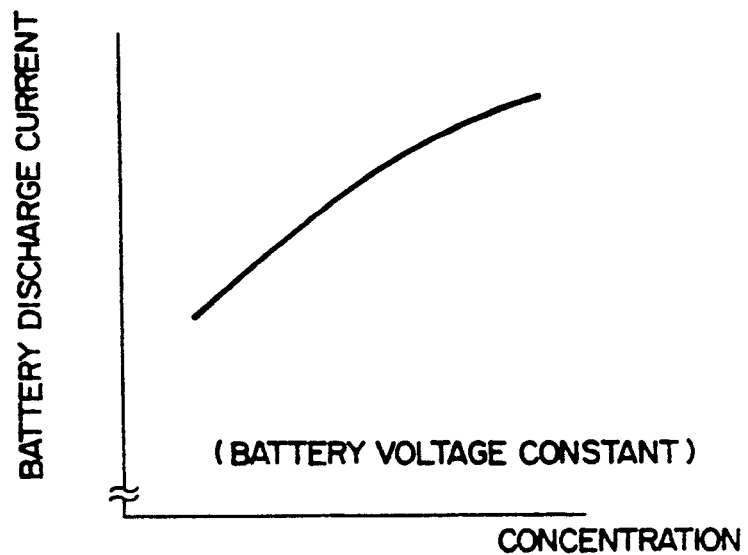
FIG. 5 is a characteristic diagram showing the relationship between the battery discharge current and the electrolyte concentration.
Figure 6:
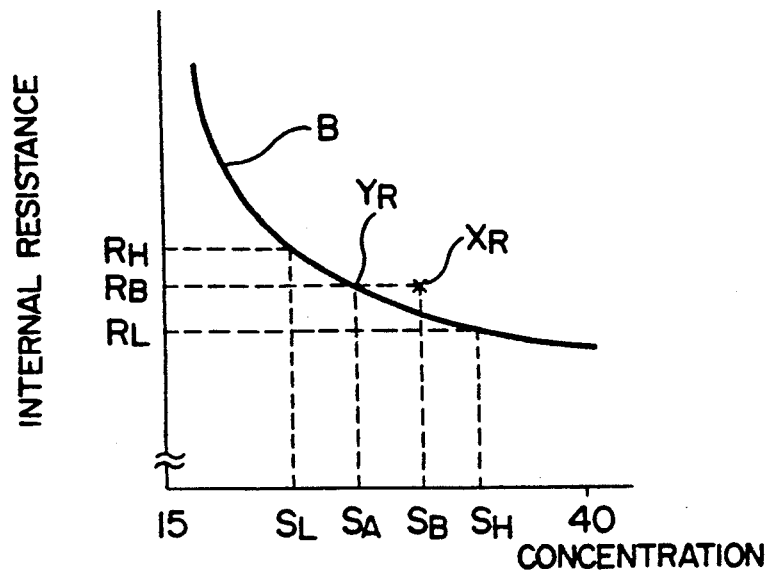
FIG. 6 is a characteristic diagram showing the relationship between the internal resistance of the battery and the electrolyte concentration.

FIG. 5 shows a characteristic of the battery current versus the electrolyte concentration when the battery voltage is maintained to be constant, and FIG. 6 shows a characteristic of the internal resistance versus the electrolyte concentration.

Figure 7:
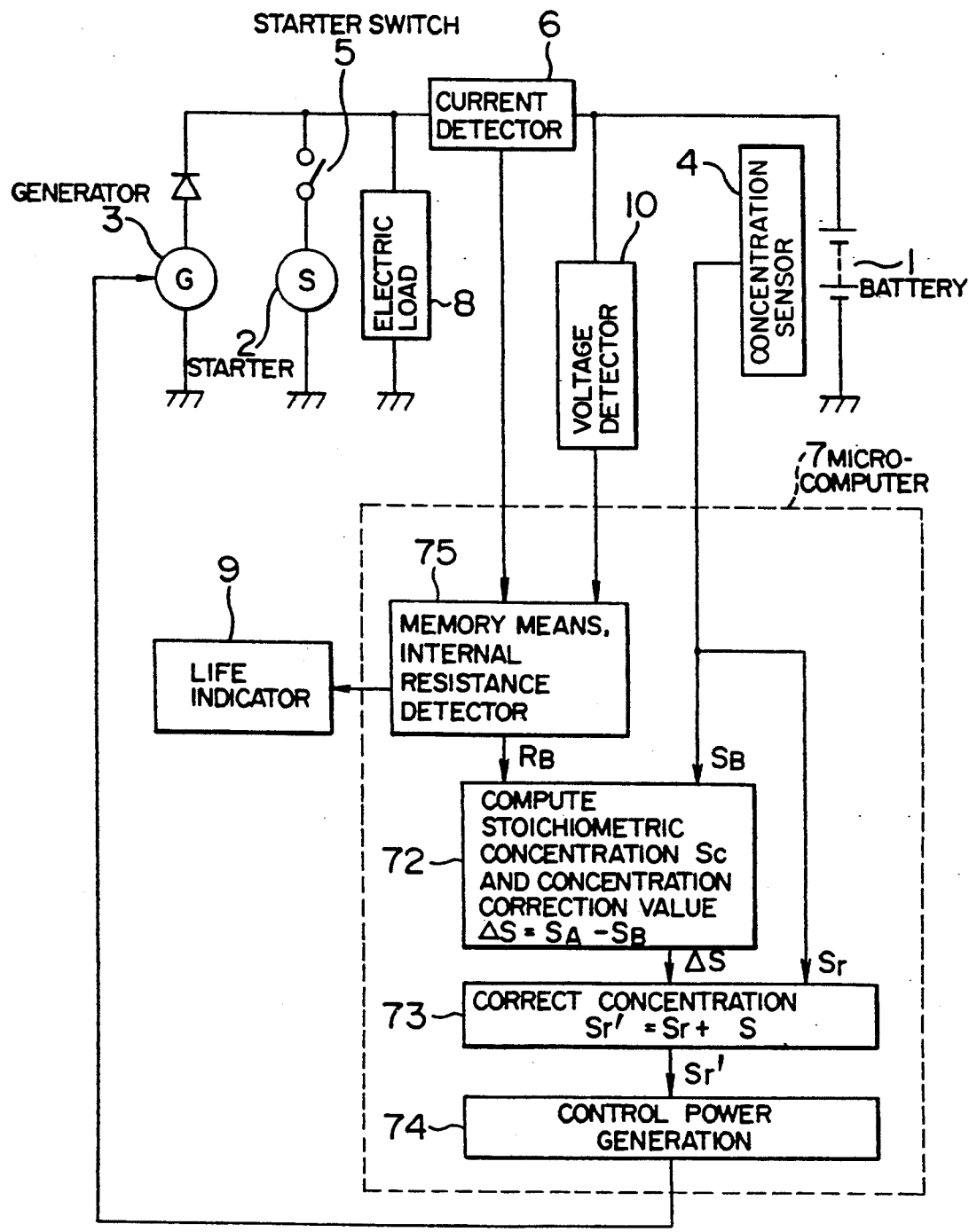
FIG. 7 is a diagram showing an electric circuit of a power generation means employing the apparatus according to a second embodiment of the present invention.
Figure 8:
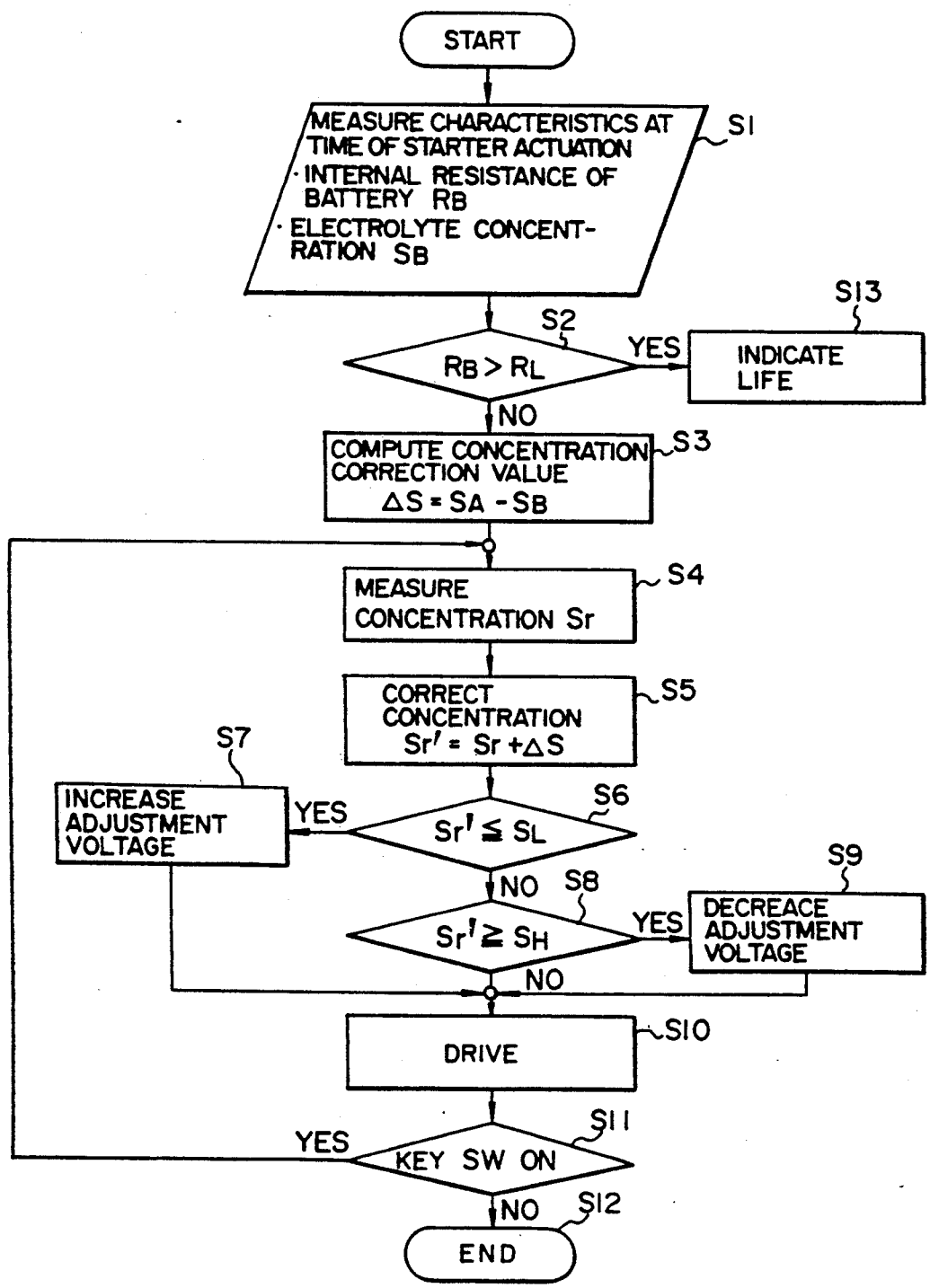
FIG. 8 is a flowchart showing the process of control in a microcomputer according to the second embodiment of the present invention.

A second embodiment of the apparatus according to the present invention is shown in FIGS. 7 and 8. According to this embodiment, in order to detect the internal resistance $R_B$ of the battery 1, a predetermined discharge current is detected by a current detector 6 and a battery voltage associated with a predetermined discharge current is determined by a battery voltage detector 10. Specifically, the internal resistance R is determined from the equation $$R = \frac{E - V}{I}.$$

The reference concentration of battery electrolyte related to the internal resistance $R_B$ is then determined from the characteristic B (shown in FIG. 6) stored in the microcomputer 7.

After the reference concentration of battery electrolyte is determined, the concentration is corrected as described with respect to the embodiment above.

In the case where the internal resistance $R_B$ remains higher than $R_H$ in spite of the power generation control, on the other hand, step 13 issues an alarm against electrolyte degradation.

Figure 9:
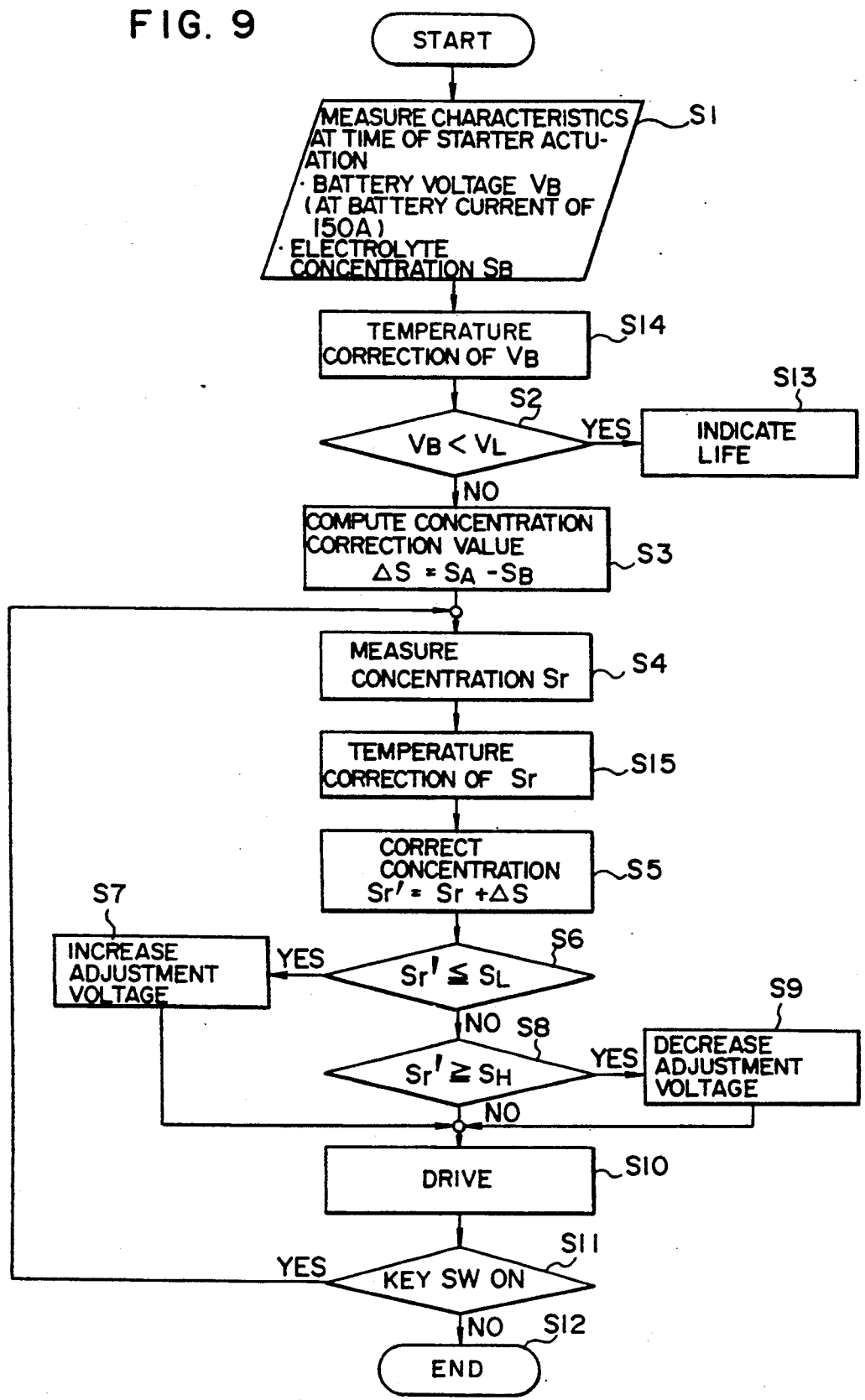
FIG. 9 is a flowchart showing the process of control in a microcomputer according to a third embodiment of the present invention.

A flowchart of a third embodiment of the apparatus according to the present invention is shown in FIG. 9. In this flowchart, as is different from the flowchart of FIG. 3, in accordance with the temperature of the battery 1, step 14 corrects the battery voltage and step 15 corrects the battery electrolyte concentration.

This is by reason of the fact that the battery characteristic (voltage at the time of discharge at step S1) and the electrolyte concentration have a temperature depending characteristic.

Step S14 corrects the battery voltage $V_B$ in accordance with the temperature registered at the temperature sensor mounted on the battery 1, which voltage is compared with the reference characteristic A of FIG. 2 stored in the microcomputer 7 as explained with reference to the first embodiment above.

As a consequence, according to the third embodiment, the voltage and concentration are corrected in response to the temperature of the battery 1, thereby providing improved accuracy of detection of the battery condition.

The concentration sensor in the aforementioned embodiment may be of such a type as disclosed by JP-A-60-24435 in which the potential difference between a lead electrode and a lead dioxide electrode is measured to determine the battery electrolyte concentration in terms of a potential.

Also, as disclosed in JP-A-55-23435, the battery electrolyte concentration may be measured indirectly from the transmission time of a sound wave.

As an alternative, ions caused by dissociation of sulfuric acid may be detected by an electrode for detecting the hydrogen ion concentration and an auxiliary electrode as taught by JP-A-60-112266.

Furthermore, the battery electrolyte concentration may be alternatively measured indirectly by using refraction, float or the like.

Now, an explanation will be made of still another embodiment in which accurate internal impedance of the battery is obtained from a predetermined battery discharge current and a plurality of battery voltages associated therewith or from a predetermined battery voltage and an average value of a plurality of battery discharge currents associated therewith, thereby determining the battery condition.

Figure 12A:
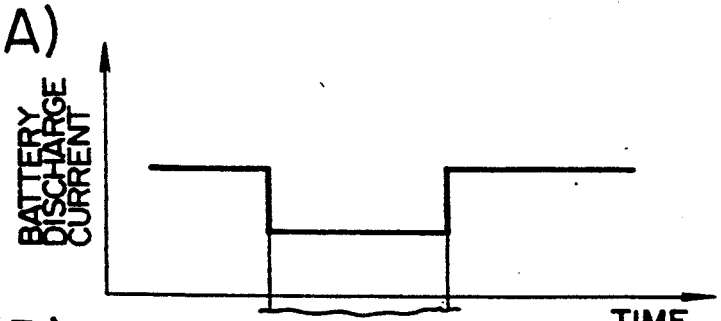
FIGS. 12(A) and 12(B) are diagrams showing a change with time of the battery voltage when the battery discharge current is changed stepwise.
Figure 12B:
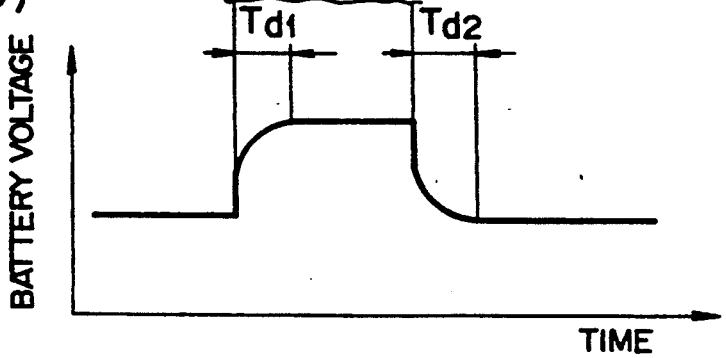
Figure 13A:
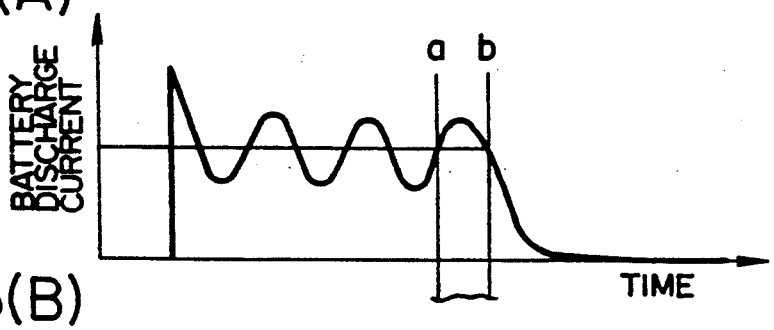
FIGS. 13(A) and 13(B) are diagrams showing a change with time of the battery discharge current and battery voltage at the time of starter actuation.

As shown in FIG. 12(A), upon a steep stepwise change in battery discharge current, the battery voltage undergoes a change with delay time Td1, Td2 (FIG. 12(B)). At the time of the starter actuation, the battery discharge current fluctuates periodically as shown in FIG. 13(A), and therefore the battery voltages differ from each other even at points a and b in FIG. 13(A) where the discharge currents have the same value with each other. Specifically, the battery voltage assumes a higher value (V2) in the process of a change in the discharge current from a low to high value (at point a in FIG. 13(A)), and the battery voltage assumes a lower value (V2) in the reverse case (at point b in FIG. 13(A)). The battery discharge current at the time of starter actuation, as seen from the same diagram, is represented by periodical repetitions of the same waveform, resulting in the substantially opposite discharge causation at points a and b.

In such a situation, each couple of battery voltages has almost the opposite discharge causation. By calculating an average of these battery voltages, therefore, the effects of the respective discharge causation cancel each other to produce a real battery voltage. This battery voltage indicates the same value as the battery discharge current and hence the internal impedance of the battery, whereby it is possible to determine the charging condition of the battery accurately.

If a plurality of battery discharge currents are detected for the same value of battery voltage and an average thereof is calculated, on the other hand, the real value of discharge current against the battery voltage is obtained, which in turn determines accurate internal impedance, thus making it possible to know an accurate charging condition of the battery.

A fourth embodiment shown in FIG. 10 will be explained below as an example having the functions mentioned above.

Figure 10:
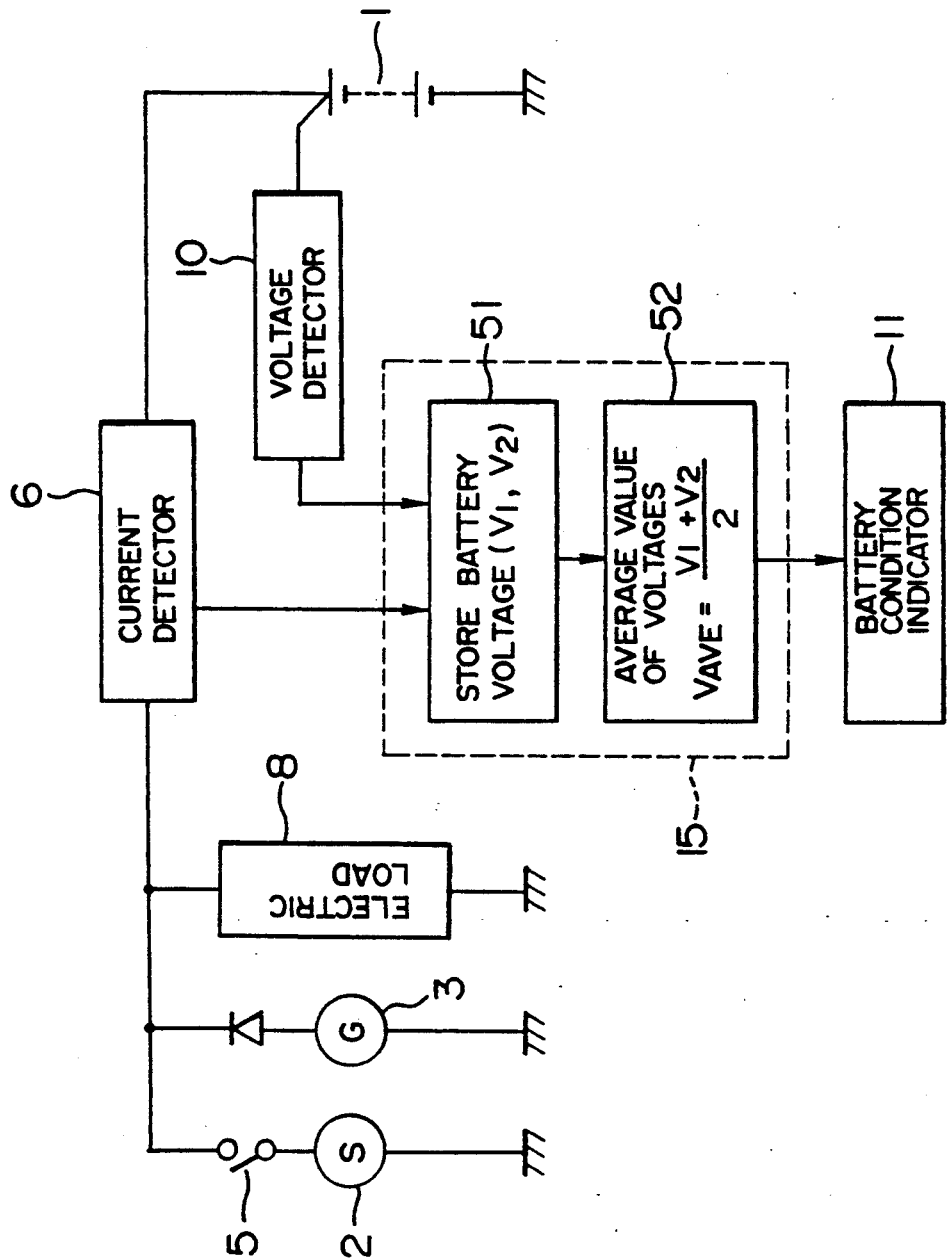
FIGS. 10 and 11 are block diagrams showing a general configuration of the apparatus according to the fourth and fifth embodiments of the present invention respectively.

In FIG. 10, a battery 1 is connected with a charge generator 3, an electric load 8 and a starter 2 through a starter switch 5. The voltage across the battery 1 is detected by a voltage detector 10 and applied into a computer 15. The discharge current of the battery 1, on the other hand, is detected by a current detector 6 and also inputted into the computer 15.

Figure 13B:
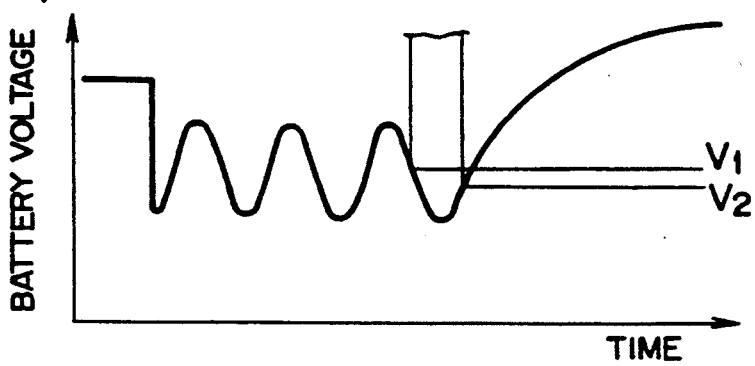

Upon turning on the starter switch 5, the starter 2 is energized with power supplied thereto from the battery 1, and as shown in FIG. 13, a periodically changing discharge current begins to flow, thereby causing corresponding fluctuations of the battery voltage.

The computer 15 includes a memory 51 and a computation unit 52. The memory 51 reads and stores therein two successive battery voltages V1 and V2 (at points a and b in FIG. 13(A)) when the discharge current stands at a predetermined value (say, 150 A). The computation unit 52 computes an average $V_{AVE}$ of the battery voltages V1 and V2, and indicates the charging condition of the battery on a battery condition indicator 11 on the basis of the average $V_{AVE}$.

Now, an explanation will be made of a fifth embodiment in which the specific gravity of the electrolyte related to the aforementioned average battery voltage is determined and a corrected value of the specific gravity is used for deciding the charging condition to control the power generation. It should be noted that, in the embodiments of the present invention described hereinafter, the detection of the specific gravity of the battery electrolyte is used for the detection of the battery electrolyte concentration.

This embodiment represents an application of the present invention to an apparatus for detecting the specific gravity of the battery electrolyte during engine operation and thus improving the battery charging condition on the basis of the detected specific gravity. The specific gravity thus detected, which reflects the battery charging condition faithfully, is affected by the evaporation of the battery electrolyte or the like phenomenon as well as the charging condition, and therefore, it is required to be corrected at the time of starting the engine.

For this purpose, the specific gravity of the battery electrolyte is determined in advance as a stoichiometric specific gravity $S_A$ for each voltage of a new battery discharged with a predetermined discharge current. The specific gravity $S_B$ for the average voltage value $V_{AVE}$ obtained upon actuation of the starter in the same configuration as the fourth embodiment is corrected, and the resulting correction value is used to correct the specific gravity of the battery electrolyte during an engine operation thereby to decide the charging condition.

A fifth embodiment of the invention will be explained in detail with reference to FIG. 11.

Figure 11:
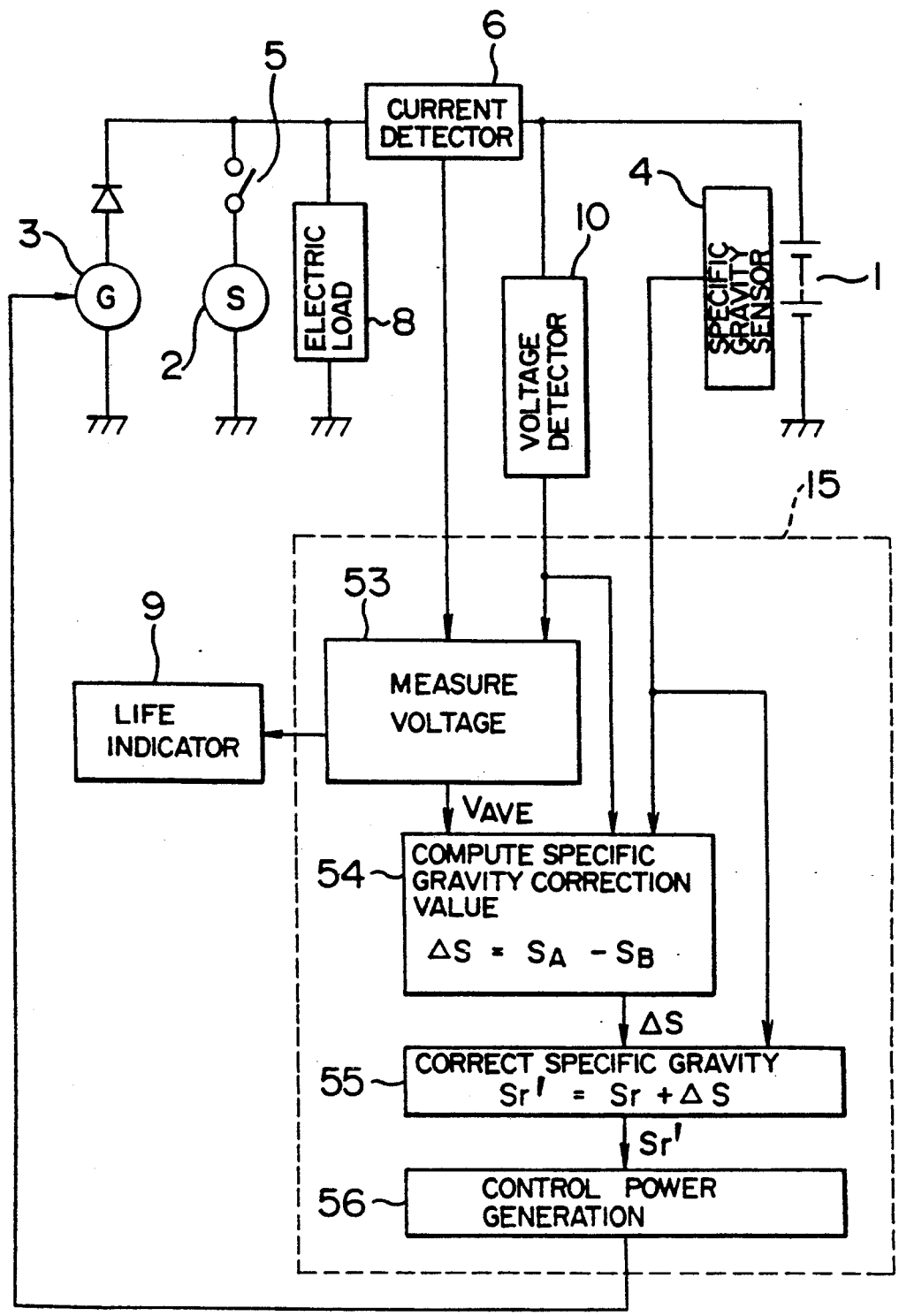

In FIG. 11, a battery 1 is provided with a specific gravity sensor 4 for producing the specific gravity of the battery electrolyte, which specific gravity is applied to a computer 15. The computer 15 includes voltage measuring means 53, specific gravity correction value computation means 54, specific gravity correction means 55 and power generation control means 56. The voltage measuring means 53 has a memory 51 and a computation unit 52 as those of the fourth embodiment. This voltage measuring means 53 is supplied with battery voltages V1 and V2 in the state of the discharge current having a predetermined value and produces an average value $V_{AVE}$ of the battery voltages V1 and V2.

The correction value computation means 54 computes a correction value $\Delta S$ as a difference between an actually measured specific gravity $S_B$, which is given by a specific gravity corresponding to the average value $V_{AVE}$ of the battery voltage, and a stoichiometric specific gravity $S_A$.

After the engine is started, a detected specific gravity $S_r$ is corrected by using the correction value $\Delta S$ to obtain a real specific gravity $S_r'$, and the power generation control means 56 changes the adjustment voltage of the charging generator 3 in such a manner as to keep the specific gravity $S_r'$ always in a predetermined range, thereby maintaining a proper charging condition of the battery 1.

In the case where the average value $V_{AVE}$ is reduced below a voltage required for actuating the starter, the life indicator 9 is turned on indicating the necessity of changing the battery 1.

In this way, a real battery voltage is determined by the voltage measuring means 53, thereby making it possible to make accurate correction of the specific gravity.

In each of the above-mentioned embodiments, an average value of battery voltage is obtained from a couple of voltage measurements. If an average value is obtained from further more plural times of voltage measurements, however, the accuracy will be improved.

Instead of calculating an average value of the battery voltages in the state of the battery discharge current having a predetermined value, an average value of the discharge current in the state of the battery voltage having a predetermined value may be computed. In this way, the internal impedance of the battery may be obtained in the same way, thereby making it possible to make accurate determination of the battery charging condition.

Now, still another embodiment of the present invention will be explained, in which an approximation line, which is determined by battery current values and voltage values detected at a plurality of time points while the starter is actuated, is used to compute the value of a reference discharge time terminal voltage of the battery so that the battery condition is determined on the basis of the value of the reference discharge time terminal voltage of the battery.

Figure 15:
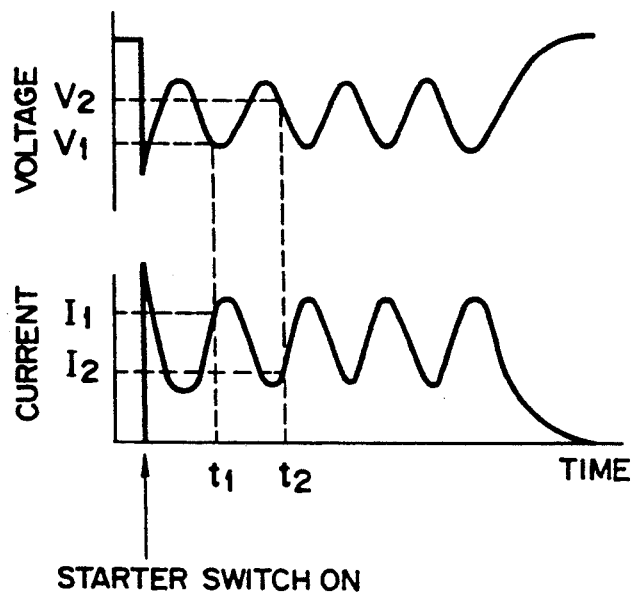
FIG. 15 is a waveform diagram for explaining the operation of the sixth embodiment of the present invention.
Figure 16:
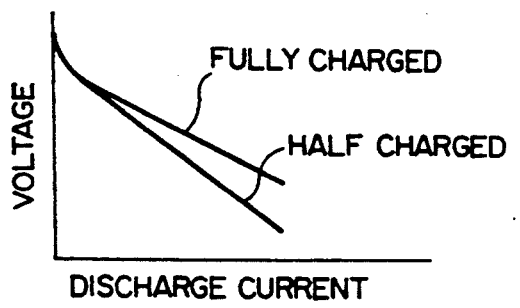
FIG. 16 shows a battery discharge characteristic.
Figure 17:
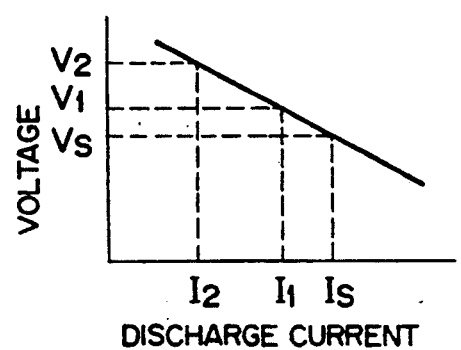
FIG. 17 is a graph for explaining an example of computation of the reference discharge time terminal voltage.

This sixth embodiment is based on the facts that the relationship between a discharge current and a terminal voltage of a battery is linear at the time of high-rate discharge of a current density of more than about 100 mA/cm$^2$ per unit battery electrode as shown in FIG. 16, and that the discharge current flowing through the starter when it is actuated is large enough to correspond to high-rate discharge and has a large pulsation due to load variations. In this embodiment, the terminal voltages and the discharge currents having a large pulsation are measured at a plurality of (two or more) time points. In the case shown in FIG. 15, for example, the discharge currents and the terminal voltages are measured as the current $I_1$ and the voltage $V_1$ at the time point $t_1$ and as the current $I_2$ and the voltage $V_2$ at the time point $t_2$. These currents and voltages generally assume different values because the current is pulsating. The reference discharge time terminal voltage computation means makes linear approximation of the relationships of the measured currents and voltages such as ($I_1$, $V_1$), ($I_2$, $V_2$), computes a reference discharge time terminal voltage $V_S$ in the state of a predetermined reference discharge time current value $I_S$ by using extrapolation or interpolation as shown in FIG. 17. The terminal voltage $V_S$ thus computed coincides substantially with the terminal voltage $V_S$ as measured actually by causing the reference discharge current $I_S$ to flow in view of the linear current-voltage relationship during high-rate discharge.

Figure 14:
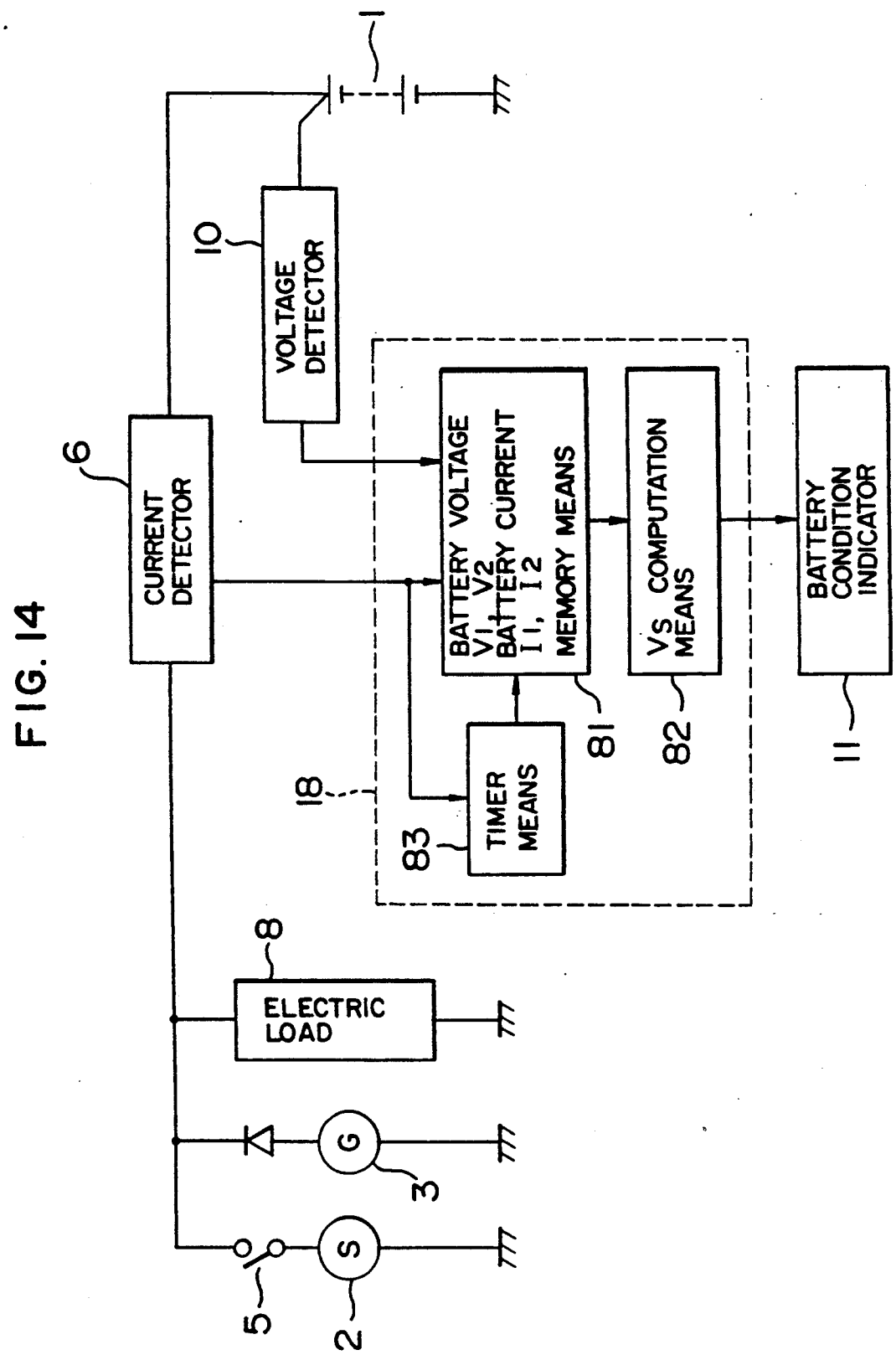
FIG. 14 shows a circuit configuration of the sixth embodiment of the present invention.

A sixth embodiment of the present invention will be explained with reference to the accompanying drawings. A configuration of a battery condition detection apparatus is shown in FIG. 14. A car battery 1 is connected to a given electric load 8 such as a lamp and a generator 3, and also to an engine starter 2 through a starter switch 5. The wires leading from the battery 1 to the loads 8, 2 are connected to a current detector 6 including a shunt resistor or the like to detect the discharge current of the battery 1. The positive terminal of the battery 1 is connected to a voltage detector 10.

The outputs of the current detector 6 and the voltage detector 10 are connected to a microcomputer 18. Upon receipt of signals from the detectors 6, 10 at an A/D converter thereof, the microcomputer 18 causes a CPU thereof to take the data into a memory. Except for the hardware configuration which is well known, means for realizing the processing operation in the CPU are shown in this diagram. The microcomputer 18 includes memory means 81, reference discharge time terminal voltage computation means 82 (abbreviated as $V_S$ computation means 82) and timer means 83. The output of the microcomputer 18 is connected to a battery condition indicator 11.

The operation of this embodiment will be explained with reference to FIG. 15. Upon turning on the starter switch to start the engine, the timer means 83 detects that the cranking operation is started and continues, by a great rise in the current value, and notifies the memory means 81 of a plurality of predetermined time points $t_1$ and $t_2$ after the start of the cranking operation. The memory means 81 stores the current values $I_1$, $I_2$ and the voltage values $V_1$, $V_2$ at the time points $t_1$, $t_2$. During cranking, the discharge current assumes a large value accompanied by a great pulsation, and therefore measurements at different time points $t_1$, $t_2$ make it possible to measure terminal voltages $V_1$, $V_2$ for different large currents $I_1$, $I_2$.

The $V_S$ computation means 82, as shown in FIG. 17, computes the reference discharge time terminal voltage $V_S$ in the state of the reference discharge current value $I_S$ by making extrapolation, which uses a first-order equation, of a plurality of measured values of ($I_1$, $V_1$) and ($I_2$, $V_2$). The reference discharge time terminal voltage $V_S$ provides an index accurately representing a condition of the battery 1. When this terminal voltage $V_S$ is smaller than a predetermined level, the microcomputer 18 produces a signal to a battery condition indicator 11 issuing an alarm to inform the driver of the battery capacity shortage.

Apart from the case of FIG. 17 in which the reference discharge time current value $I_S$ is larger than the two current measurements $I_1$ and $I_2$ and extrapolation computation is required, linear approximation may also be used to obtain the reference discharge time current value $I_S$ by making interpolation in the case where the reference discharge time current value $I_S$ falls between two measurements $I_1$ and $I_2$.

Although the reference discharge time terminal voltage $V_S$ is computed from measured values at the two points in the sixth embodiment described above, it is possible to determine a more accurate reference discharge time terminal voltage $V_S$ from current and voltage measurements at more time points. Also, if points of measurement are increased, it is possible to avoid a computation failure which might occur by unexpected coincidence of two current or voltage values measured at two different predetermined time points.

Further, instead of the time lengths $t_1$, $t_2$ elapsed from the start of the cranking operation used in the present embodiment, a change in the current value may be used in determining the time points of measurement. For example, a voltage may be measured at the second time immediately after a change $\Delta I$ in the current value from the first measuring point.

Furthermore, it is also possible to improve the computation accuracy of the voltage $V_S$ by discriminating a pulsation in the current value and making measurement at time points of peak and bottom of the pulsation.

Instead of alarm indication based on the reference discharge time terminal voltage $V_S$ calculated according to the present invention, the amount of power generation of the generator 3 may be controlled on the basis of the terminal voltage $V_S$ with equal effect.

Figure 18:
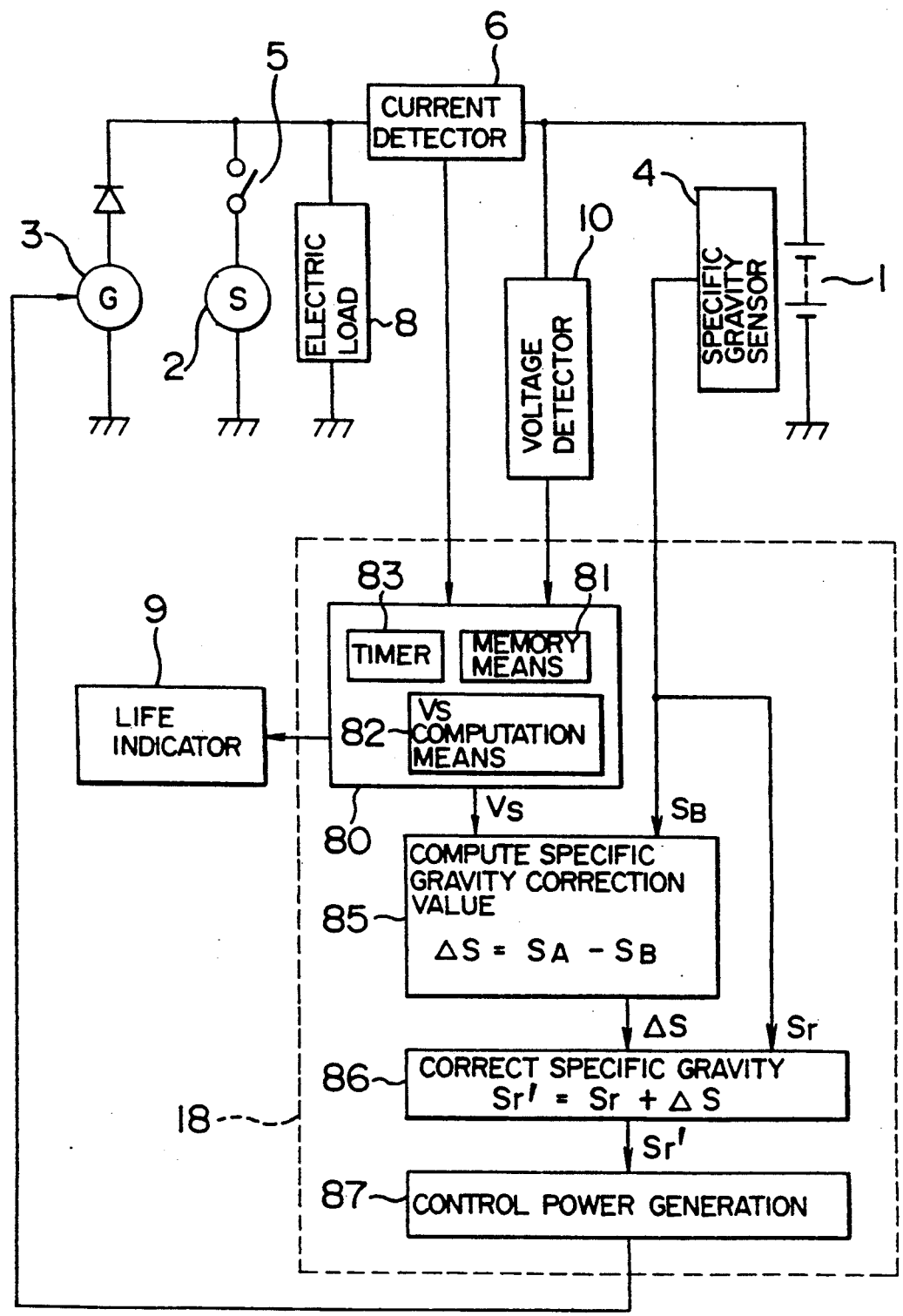
FIG. 18 shows a circuit configuration of the seventh embodiment of the present invention.

A seventh embodiment in which the amount of power generation is controlled is shown in FIG. 18. This seventh embodiment has added thereto a specific gravity sensor 4 for detecting the specific gravity of the electrolyte of the battery 1. The microcomputer 18 includes timer means 83, memory means 81 and $V_S$ computation means 82. In addition to the $V_S$ measuring means 80 for measuring and computing the reference discharge time terminal voltage $V_S$, means 85, 86, 87 are provided for the power generation control.

The process of the power generation control will be explained. The reference discharge time terminal voltage (abbreviated as the terminal voltage $V_S$) is measured and computed based on the current pulsation occurring at the time of cranking, and the specific gravity of the battery electrolyte is measured and compared with the terminal voltage $V_S$ thereby to discriminate the battery condition and to effect power generation control.

In addition to the above explanation, FIG. 2 shows a battery voltage curve A versus the specific gravity of the battery electrolyte (indicated in the parentheses under the abscissa) when the starter 2 is actuated by using a new battery 1.

Assume, for example, that the terminal voltage $V_S$ of the battery 1 and the specific gravity $S_B$ are determined at the time of driving the starter 2 as shown by a point X. In this case, the specific gravity $S_B$ is high as compared with the specific gravity $S_A$ (point Y) for the reference characteristic A, indicating that the battery 1 is degraded (a reduced quantity of electrolyte or an exhausted life of the battery 1, for example).

Specifically, as long as the specific gravity of the electrolyte of the battery 1 is more than $S_L$ with respect to the reference characteristic A, the battery voltage exceeds $V_L$, thus making it possible to drive the starter 2. If the battery 1 is degraded as mentioned above, however, the specific gravity S is increased, leading to a decision that apparently the battery voltage is also high. If the specific gravity S is used to effect the control according to the reference characteristic A, a low battery voltage in spite of a high specific gravity S would make it impossible to drive the starter 2.

In order to solve this problem, the reference specific gravity $S_A$ of battery electrolyte for the battery terminal voltage $V_S$ is determined on the basis of the reference characteristic A stored in the microcomputer 18, and the specific gravity is corrected by using the actual measurement of the specific gravity $S_B$ and the reference value $S_A$, thereby making it always possible to obtain accurate specific gravity for a predetermined voltage. As a result, an accurate condition of the battery 1 is always detected by correcting the specific gravity obtained from the specific gravity sensor 4.

If power generation is controlled on the basis of the corrected specific gravity $S_r'$, the battery voltage at the time of starter actuation is always higher than $V_L$, thus permitting the starter 2 to be driven always accurately.

Since there is no need of charging the battery 1 more than necessitated (increasing the adjustment voltage to an unnecessary degree), the adjustment voltage can be reduced to save the load of the generator 3 on the engine, resulting in an improved fuel efficiency. Further, the amount of charging the battery 1 is reduced to provide an advantage of preventing a reduction in the electrolyte quantity.

In other words, power generation is controlled in such a manner as to keep the corrected specific gravity value $S_r'$ in the range of $S_L \leq S_r' \leq S_H$, so that the battery is maintained in a balanced condition while at the same time assuring smooth starting of the engine (preventing emptying of a battery) and providing an improved fuel efficiency and a lesser rate of reduction in the electrolyte quantity.

If it is impossible to charge the battery as intended simply by changing the adjustment voltage in view of the power generation capacity of the generator 3, the above-mentioned effect could be assured to a higher degree by improving the charging capacity or preventing discharge, by raising the idling speed or cutting off the electric load of the engine.

Figure 19:
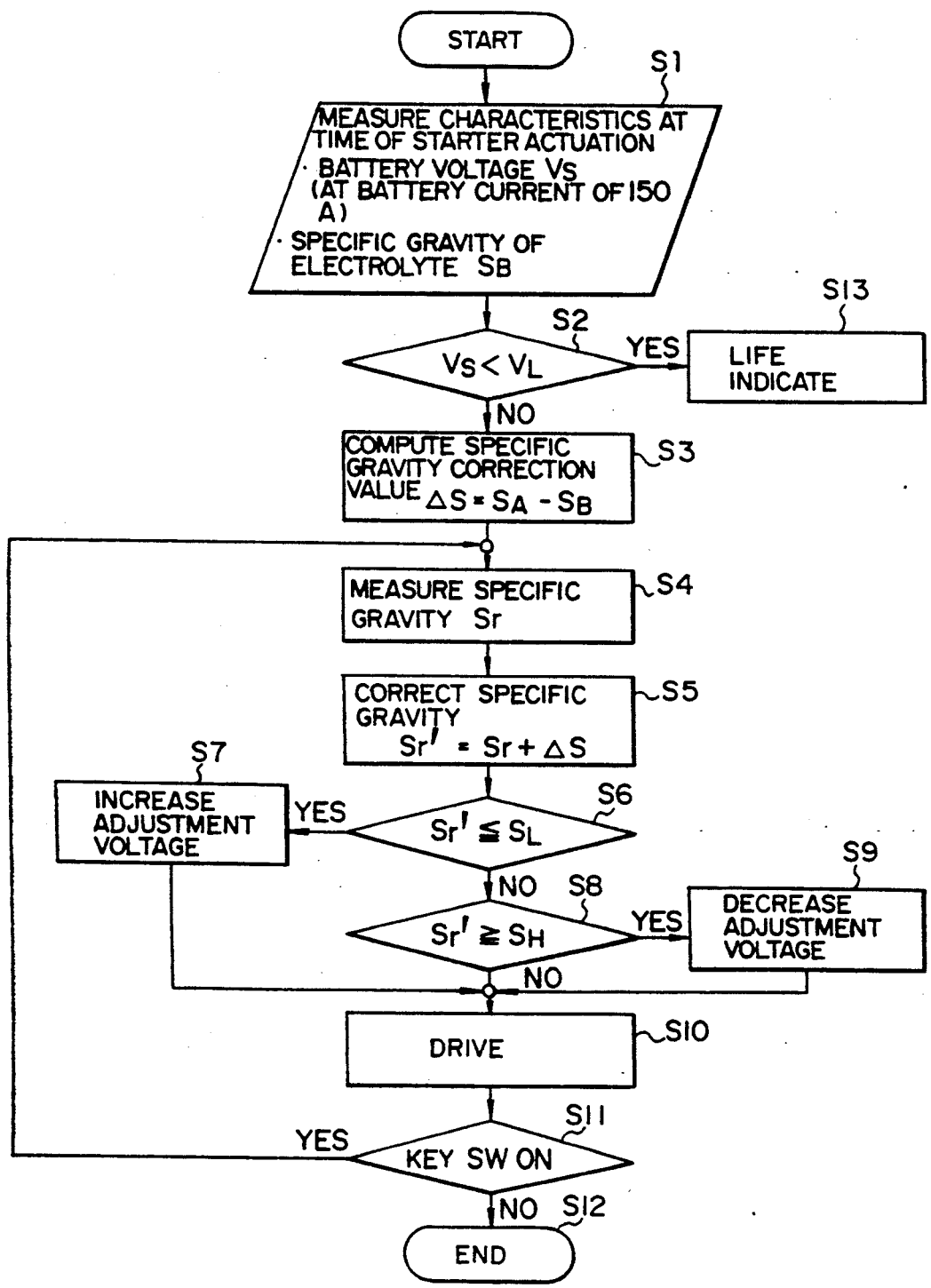
FIG. 19 is a flowchart showing the processing steps of the microcomputer.

The operation of the microcomputer 18 for realizing the aforementioned control concept will be explained with reference to FIG. 19.

Step 1 computes the terminal voltage $V_S$ at the time of reference discharge of the battery 1 from a pulsation current occurring when the starter 2 is actuated. At the same time, the specific gravity $S_B$ of the battery electrolyte is detected by the specific gravity sensor 4 and is stored.

Step 2 checks to see whether the terminal voltage $V_S$ thus measured and computed is lower than the lower limit voltage $V_L$, and, if it is lower, indicates that the exhaust of the battery life is approaching, on the life indicator 9.

Step 3 calculates and stores a specific correction value $\Delta S$ ($=S_A-S_B$) from the reference specific gravity $S_A$ for the stored terminal voltage $V_S$ and the measured specific gravity $S_B$. This process is effected at specific gravity correction value computation means 85.

Step 4 detects the specific gravity $S_r$ of the electrolyte of the battery 1 by the specific gravity sensor 4 at a predetermined later time point (when the vehicle is running, for example).

Step 5 adds the specific gravity correction value $\Delta S$ obtained at step 3 to the specific gravity $S_r$ determined at step 4, thereby producing a real specific gravity $S_r'$. This process is performed by specific gravity correction means 86.

In view of a steadily changing battery characteristic (represented by the relationship between the electrolyte specific gravity and the terminal voltage $V_S$ at the time of discharge as determined by the battery life, electrolyte quantity, etc.), it is sufficient to measure the specific gravity correction value $\Delta S$ only at the time of starter actuation once for each drive.

Steps 6 to 9 change the adjustment voltage in such a manner that the corrected specific gravity value $S_r'$ is maintained in the range $S_L \leq S_r' \leq S_H$. Specifically, if $S_r' \leq S_L$, the adjustment voltage is increased at step 7, while if $S_r' \geq S_H$, the adjustment voltage is decreased at step 9. The upper limit value $S_H$ is determined appropriately from the viewpoint of fuel efficiency and the like to have a predetermined marginal band for the lower limit value $S_L$. The processes from steps 6 to 9 are performed by power generation control means 7.

The vehicle then continues to be driven (step 10). The processes of steps 4 to 10 are repeated as long as the key switch remains in the "on" state (step 11).

While, in the present embodiment, the discharge current ($I_S$) providing a reference is determined to obtain a terminal voltage $V_S$, since the relation between a discharge current and a terminal voltage of a battery is determined by the internal impedance of the battery, a discharge current corresponding to a reference terminal voltage or the internal impedance obtained from the relationship between the terminal voltage and discharge current may obviously be used alternatively to indicate the battery condition or to control power generation with equal effect.

We claim:

1. An apparatus which detects a condition of a battery which operates using a reactive substance in an electrolyte thereof, said apparatus comprising:
   a battery voltage detector for detecting a voltage of the battery and providing a battery voltage signal;
   a battery current detector, connected in a battery discharge path, for detecting a discharge current of said battery and providing a battery current signal;
   a battery electrolyte concentration detector for detecting a value representing a concentration of the reactive substance in the electrolyte of the battery and providing a battery electrolyte concentration signal;
   memory means for storing a standard characteristic representing a standard value of the concentration of the reactive substance in the electrolyte of said battery at a time when said battery current signal reaches a predetermined value, as a function of one of a voltage and an internal resistance of said battery;
   computation means for receiving said battery voltage signal provided by said battery voltage detector at a time when said battery current signal reaches the predetermined value, and for obtaining a value representing the standard concentration of the reactive substance in said battery using a value of the voltage of said battery or a value of the internal resistance to obtain the standard characteristic stored in said memory means, the value thus obtained being outputted as a standard concentration value;
   correction value computation means for receiving said battery electrolyte concentration signal provided by said battery electrolyte concentration detector, at a time near when said computation means receives said battery voltage signal and for computing a concentration correction value on the basis of said battery electrolyte concentration signal and the standard concentration value inputted from said computation means; and
   correction means for correcting said battery electrolyte concentration signal provided by said battery electrolyte concentration detector by using the concentration correction value obtained by said correction value computation means to provide a corrected battery electrolyte concentration signal.

2. A battery condition detection apparatus according to claim 1, wherein said computation means includes means for temperature compensating a parameter used in the computation by said computation means and the value of the reactive substance concentration of said battery corrected by the concentration correction value.

3. A battery condition detection apparatus comprising:
   a battery;
   a connection terminal to a starter fed by said battery;
   means for detecting a discharge current of said battery and for providing a discharge current signal;
   means for detecting a battery voltage and for providing a battery voltage signal;
   memory means for storing a plurality of battery voltage values, which battery voltage values assume different values when said discharge current signal is continuous at a predetermined value due to a phase difference between waveforms of said discharge current signal and said battery voltage signal, at a time when said discharge current signal varies periodically at a time of starting of said starter, wherein said battery voltage signal varies with a waveform opposite to that of said discharge current signal;

computation means for calculating an average battery voltage value of the plurality of battery voltage values stored in said memory means; and means for detecting a battery condition based on the average battery voltage value obtained by said computation means and on the discharge current signal having the predetermined value, said detecting means providing said average battery voltage value as a true battery voltage signal at the time when said discharge current value assumes the predetermined value.

4. A battery condition detection apparatus comprising:

a battery;

a connection terminal to a starter fed by said battery;

means for detecting a discharge current of said battery and for providing a discharge current signal;

means for detecting a battery voltage and for providing a battery voltage signal;

memory means for storing a plurality of discharge current values, said discharge currents assuming different values when said battery voltage signal is continuous at a predetermined value due to a phase difference between waveforms of said battery voltage signal and said discharge current signal, at the time when said battery voltage signal varies periodically at the time of start of said starter, wherein said discharge current signal varies with a waveform opposite to that of said battery voltage signal;

computation means for calculating an average discharge current value of the plurality of discharge current values stored in said memory means; and means for detecting a battery condition based on the average discharge current value obtained by said computation means and on the battery voltage signal having the predetermined value, said detecting means providing said average discharge current value as a true discharge current signal at the time when the battery voltage assumes the predetermined value.

5. A battery condition detection apparatus comprising:

a discharge current detector for detecting a discharge current of a battery, said discharge current flowing through a starter and providing a discharge current signal;

a terminal voltage detector for detecting a terminal voltage of said battery and providing a terminal voltage signal;

memory means for storing current values and voltage values detected by said current detector and said voltage detector, respectively, at a plurality of time points while said starter is actuated; and reference discharge time terminal voltage computation means for obtaining a characteristic representing a relationship between the battery discharge current signal and the terminal voltage signal during actuation of said starter by making a linear approximation of the current values and the voltage values stored in said memory means at the plurality of time points, and for computing a reference discharge time terminal voltage corresponding to a predetermined reference discharge current based on said characteristic representing the relationship between the battery discharge current signal and the terminal voltage signal; and means for detecting a battery condition on the basis of the reference discharge time terminal voltage and for providing a time discharge signal.

6. A battery condition detection apparatus comprising:

a battery voltage detector for detecting a voltage of a battery and providing a battery voltage signal;

a battery current detector for detecting a discharge current of said battery and for providing a battery current signal;

a battery electrolyte concentration detector for detecting a value representing a concentration of a reactive substance in an electrolyte of said battery and for providing a battery electrolyte concentration signal;

memory means for storing a standard characteristic of one of the discharge current and an internal resistance of said battery corresponding to the value representing said battery electrolyte concentration signal at a time when said battery voltage signal reaches a predetermined value;

computation means for receiving said battery discharge current signal provided by said current detector at the time when said battery voltage signal reaches substantially a predetermined value, and for obtaining a value representing the concentration of the reactive substance in said battery, from a value of the discharge current of said battery or a value of the internal resistance as a function of said battery discharge current signal, and on the basis of the standard characteristic stored in said memory means, the value thus obtained being outputted as a standard concentration value;

correction value computation means for receiving said battery electrolyte concentration signal provided by said battery electrolyte concentration detector, at the time when said computation means receives said battery discharge current signal, or before or after this receiving time, and for computing a concentration correction value on the basis of said battery electrolyte concentration signal and the standard concentration value inputted from said computation means; and correction means for correcting said battery electrolyte concentration signal provided by said battery electrolyte concentration detector by using the concentration correction value obtained by said correction value computation means to provide a corrected battery electrolyte concentration signal.

7. A battery condition detection apparatus according to claim 6, wherein a parameter used in the computation by said computation means is corrected to have a value equal to that at the time a predetermined time later when the parameter is settled.

8. A battery condition detection apparatus comprising;

a first battery characteristic detector for detecting a first characteristic of said battery and for providing a first characteristic signal, said first characteristic being a concentration of a reactive substance in an electrolyte of said battery;

a second battery characteristic detector for detecting a second characteristic of said battery and for providing a second battery characteristic signal;

a third battery characteristic detector for detecting a third characteristic of said battery and for providing a third battery characteristic signal;

memory means for storing a standard characteristic of one of said second battery characteristic and a fourth battery characteristic, said standard characteristic corresponding to the value representing said first battery characteristic signal at a time when said third battery characteristic signal reaches a predetermined value;

computation means for receiving said second battery characteristic signal provided by said second battery characteristic detector at the time when said third battery characteristic signal reaches substantially a predetermined value, and for obtaining a value representing said first battery characteristic, from one of said second battery characteristic signal or a value of said fourth battery characteristic as a function of said second battery characteristic signal, and on the basis of the standard characteristic stored in said memory means, the value thus obtained being outputted as a standard concentration value;

correction value computation means for receiving said first battery characteristic signal provided by said first battery characteristic detector, at the time when said computation means receives said second battery characteristic signal, or before or after this receiving time, and for computing a first battery characteristic correction value on the basis of said first battery characteristic signal and the standard concentration value inputted from said computation means to provide a first battery characteristic correction signal.

* * * * *

UNITED STATES PATENT AND TRADEMARK OFFICE
CERTIFICATE OF CORRECTION

PATENT NO. : 5,193,067
DATED : March 9, 1993
INVENTOR(S) : SATO et al

It is certified that error appears in the above-identified patent and that said Letters Patent is hereby corrected as shown below:

Title page, item

"(73) Assignees: Nippondenso Co., Ltd., Kariya; Japan Storage Battery Kyoto . . . ."

to

---(73) Assignees: Nippondenso Co., Ltd., Kariya; Japan Storage Battery Company Limited, Kyoto, . . . ---

Signed and Sealed this

Fifteenth Day of March, 1994

Attest:

BRUCE LEHMAN

Attesting Officer    Commissioner of Patents and Trademarks